United States Patent
Kong

[11] Patent Number: 5,920,118
[45] Date of Patent: Jul. 6, 1999

[54] CHIP-SIZE PACKAGE SEMICONDUCTOR

[75] Inventor: Byoung Sik Kong, Kyoungki-do, Rep. of Korea

[73] Assignee: Hyundai Electronics Industries Co., Ltd., Kyoungki-do, Rep. of Korea

[21] Appl. No.: 08/992,259

[22] Filed: Dec. 17, 1997

[30] Foreign Application Priority Data

Dec. 18, 1996 [KR] Rep. of Korea ................ 1996-67617

[51] Int. Cl.⁶ ...................................................... H01L 23/06
[52] U.S. Cl. .......................................... 257/684; 257/778
[58] Field of Search .................................. 257/684, 690, 257/692, 778

[56] References Cited

U.S. PATENT DOCUMENTS 5,594,626 1/1997 Rostoker et al. ....................... 361/784
5,674,785 10/1997 Akram et al. ............................ 438/15

*Primary Examiner*—Olik Chaudhuri
*Attorney, Agent, or Firm*—Jacobson, Price, Holman & Stern, PLLC

[57] ABSTRACT

The present invention relates to a chip-size package (CSP) semiconductor, which comprises a chip having a bonding pad formed at the center portion thereof; a substrate for seating and mounting the chip thereon, which has a predetermined shaped slot formed at the center portion thereof and is formed with a signal circuit pattern on, at least, one surface thereof; an adhesive means inserted between the chip and the substrate for attaching and fixing the chip to the upper surface of the substrate so that the bonding pad of the chip may arrange above the slot; a support and protection means for protecting and supporting the chip and the substrate; and the bonding pad of the chip and the signal circuit pattern of the substrate are electrically interconnected by wire, thus forming internal circuit, thus mass-producing at low price, easily radiated its heat occurring during the operation, thus extending its durability, and improving a reliance of the package and shortening the length of the process.

3 Claims, 7 Drawing Sheets

CHIP-SIZE PACKAGE SEMICONDUCTOR

BACKGROUND OF THE INVENTION

1. Field of the Invention

The present invention relates to a chip-size package (CSP) semiconductor, and more particularly to an improved chip-size package semiconductor employing a single layer substrate specially designed to receive a conventional LOC (lead on chip) type chip as it is, thus further downsizing its thickness and improving productivity.

2. Description of Related Art

In order to downsize the semiconductor package, the CSP semiconductor have been generally proposed. The CSP semiconductor, when it is completed, has its size smaller than a conventional chip size and has been developed in various way for the purpose of reducing its thickness and downsizing its size.

Hereinafter, two typical CSP semiconductors in the prior art will be briefly described.

FIG. 1 shows a conventional CSP semiconductor receiving a LOC type chip. The CSP semiconductor comprises LOC type chip 1; and a lead frame 2 attached to the lower surface of the chip through an adhesive means 4 and supporting the chip thereon. The chip 1 and the lead frame 2 are wire bonded and interconnected, and the assembly of the chip 1 and the read frame 2 are molded by a molding compound.

However, since the CSP semiconductor employs a conventional lead frame formed in a certain shape beforehand, it decreases the efficiency of work. That is, in molding, there is a fear that the molding compound is not completely filled between the chip and the lead frame, and thus forming undesirable cavities and the lead frame is deformed. In trimming, chipping and cracking of the package may occur near the lead frame, and it is difficult to adjust the thickness of the package.

Therefore, in order to solve the above problem, the CSP structure employing a co-fired ceramic substrate, not using the lead frame, has been proposed. That is, the CSP structure has the a substrate having its both surface formed a signal circuit pattern, formed with a plurality of via for transmitting the signal between both side thereof. The chip is mounted on the substrate, and formed with bumpers for electrically interconnecting the chip and the substrate at the bottom of the chip. And then the whole body of the structure is under-filled, thereby to complete the package.

However, since it is not easy to form the via in the precise position on the substrate, the production cost of the package increases and mass production is restricted. Another problem with the prior art is that the reduction of the package's thickness is limited since the bumpers are meddled between the chip and the substrate.

SUMMARY OF THE INVENTION

Therefore, the present invention has been conceived to overcome the aforementioned problem and has an object to provide a chip-size package semiconductor, which can further reduce its thickness than the prior art by employing a single layer substrate, functioning as a base for supporting the chip, specially designed to receive a conventional LOC type chip as it is.

It is another object of the present invention to provide an improved chip-size package semiconductor, which can mass-produce at low price by forming the substrate into multi-type.

It is another object of the present invention to provide an improved chip-size package semiconductor, which can easily radiate its heat occurred during the operation by employing a substrate made of a ceramic material, and thus extending its durability.

It is another object of the present invention to provide an improved chip-size package semiconductor, which can assemble the package along with an under-filled coating by capillarity without such a molding process as in the prior art, improving a reliance of the package and shortening the length of the process.

In order to achieve the above-specified object, according to the present invention, there is provided a chip-size package semiconductor which comprises a chip having a bonding pad formed at the center portion thereof; a substrate for seating and mounting the chip thereon, which has a predetermined shaped slot formed at the center portion thereof and is formed with a signal circuit pattern on, at least, one surface thereof; an adhesive means inserted between the chip and the substrate for attaching and fixing the chip to the upper surface of the substrate so that the bonding pad of the chip may arrange above the slot; a support and protection means for protecting and supporting the chip and the substrate; and the bonding pad of the chip and the signal circuit pattern of the substrate are electrically interconnected by wire, thus forming internal circuit.

BRIEF DESCRIPTION OF THE ATTACHED DRAWINGS

Other features in structure, operation and advantages of the present invention will become more apparent to those skilled in the art from the following descriptions when read in conjunction with the accompanying drawings, in which.

DETAILED DESCRIPTIONS OF A PREFERRED EMBODIMENT

Hereinafter, the chip-size package semiconductor according to the present invention according to the present invention will be described in detail with an embodiment with reference to FIGS. 2 to 8.

Figure 1:
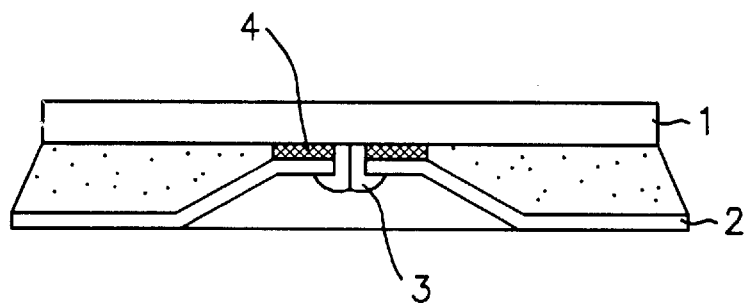
FIG. 1 is a schematic, cross-sectional view showing a conventional chip-size package semiconductor.
Figure 2A:
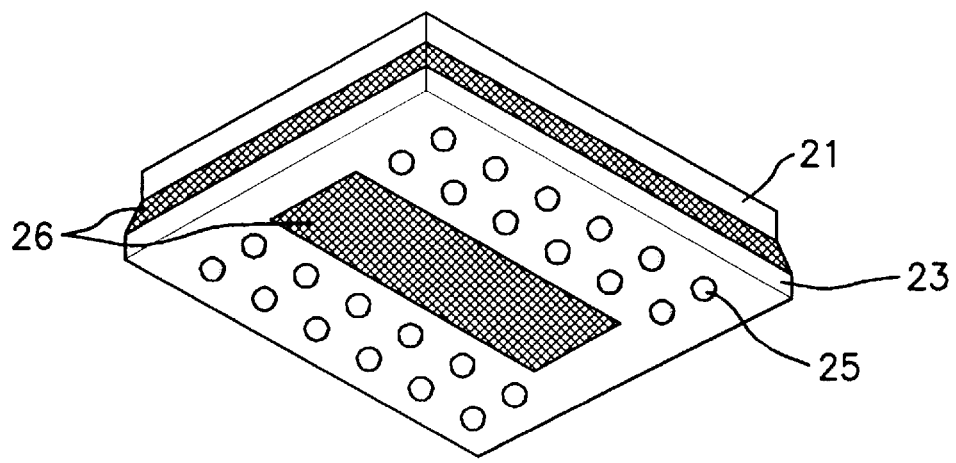
FIGS. 2A and 2B are perspective view and a cross-sectional view showing a chip-size package semiconductor according to the present invention.
Figure 2B:
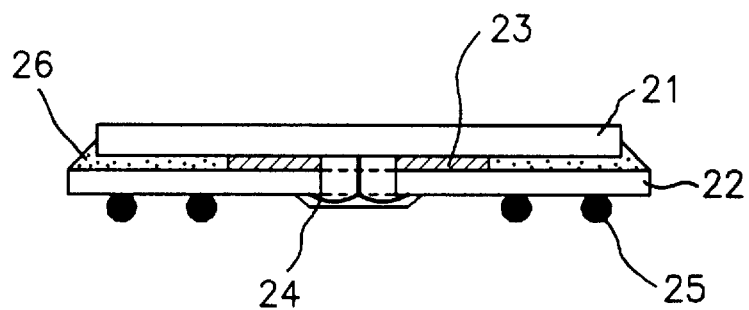

Referring to FIGS. 2A and 2B, the chip-size package semiconductor according to the present invention comprises a LOC type chip 21; a singer layer ceramic substrate 22 formed with a predetermined size of slot 22a at the center portion thereof and a signal circuit pattern 30 at the bottom surface 22c thereof; an adhesive tape 23 for supporting the chip 21 on the upper surface 22b of the substrate 22; a wire 24 for electrically interconnecting the chip 21 and the wire-bonding portion of the signal circuit pattern 30 formed at the bottom surface 22c of the substrate 22; ball 25, respectively mounted at the a plurality of ball mounting portion which formed at the bottom surface 22c of the substrate 22, for forming an external circuit; an under-filled coating portion 26 for protecting and supporting the above structural elements.

Figure 3:
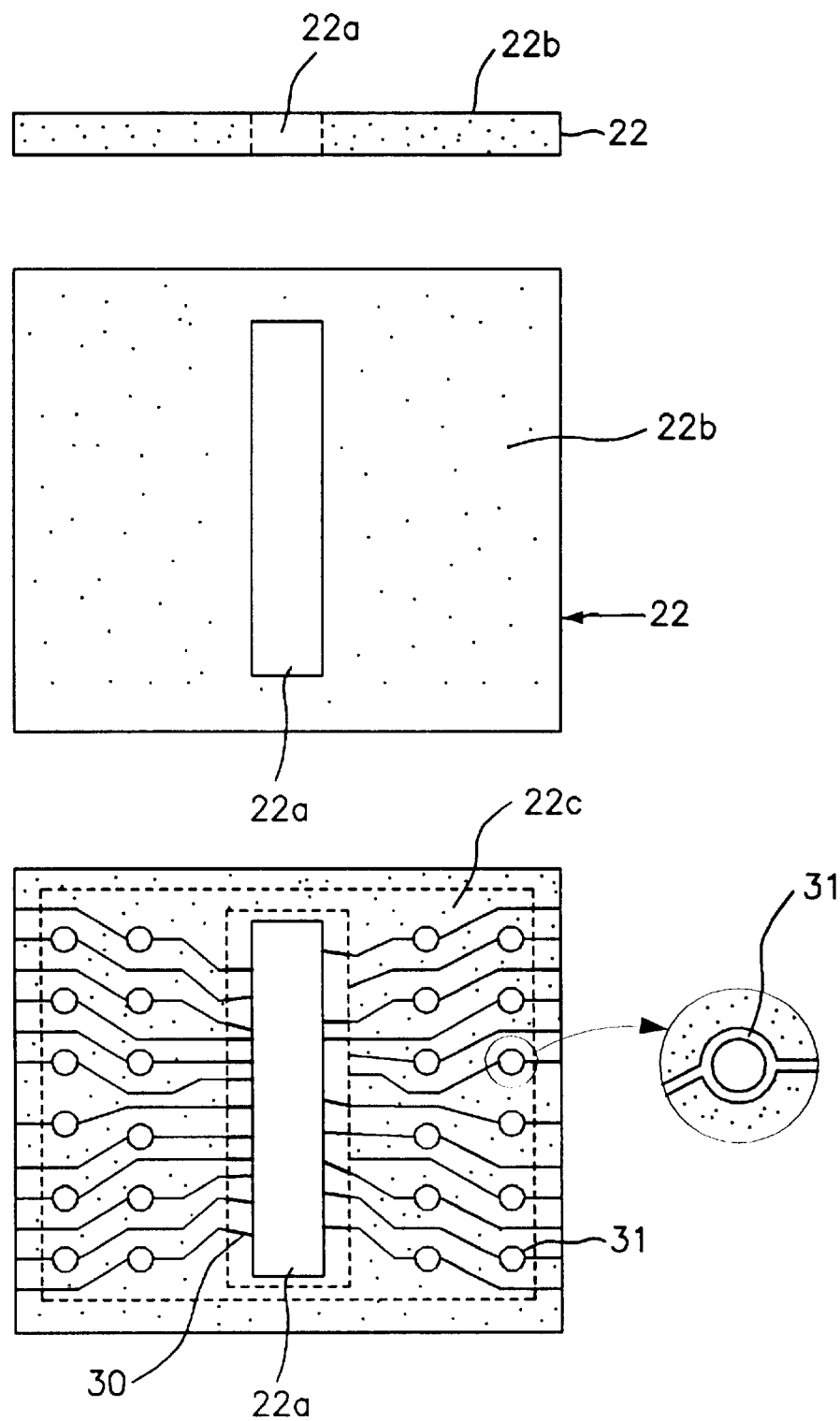
FIG. 3 is a side elevation, a plan view, and a bottom view showing a substrate of the chip-size package semiconductor according to the present invention.

As shown FIG. 3, the above stated substrate 21 made of ceramic material, serves as a base for supporting the chip in the CSP semiconductor. It is characteristic of the present invention to employ the ceramic substrate which is formed with a predetermined size of the slot 22a at the center portion thereof and formed with a signal circuit pattern 30 only on the rear surface 22c of the substrate 22 and use a conventional LOC type chip as it is, thus further reducing the thickness of the package and improving productivity. The pattern is formed by performing a gold-gilding with an electrolytic plating at the bottom surface 22c of the substrate after performing a nickel-coating by non-electrolytic plating. The signal circuit 30 includes the wire-bonding portion indicated with break line in the bottom view of FIG. 3 and a plurality of ball mounting portions 31 formed on each conductive line of the signal circuit 30. At the wire-bonding portion, the wire 24 is directly connected to the chip 21 through the slot 22a. At each ball mounting portion 31, the ball 25 is seated and mounted, thus connecting to the pattern of PCB and forming external circuit. And at the bottom surface 22c of the substrate 22, the portion except the wire-bonding portion and the ball mounting portion 31 is covered with dielectric substance and electrically insulated.

In the present invention, as stated above, since a single layer ceramic substrate 22 formed with the signal circuit pattern 30 only at the bottom surface 22c thereof is employed and the chip and the substrate are directly interconnected by wires 24 without bumps of the prior art therebetween, it is possible to make the thickness of the package thinner than that of a conventional CSP semiconductor. In the substrate 21, since a predetermined size of a single slot 22a is formed on the center portion thereof, and there is no need for forming a plurality of via in a precise position of the substrate like prior art, it is further easier to process and manufacture the package. Thus, it is possible to curtail the production cost of a package and mass-produce the package. In addition, since the substrate in the present invention is made of ceramic, the heat occurring during the operation of the chip 21 easily radiates, and a thermal stress of the package decreases, to thereby extend the durability of the chip.

Hereinafter, the assemble process of the above stated CSP semiconductor employing the single substrate will be described referring to FIG. 4 to FIG. 8.

Figure 4:
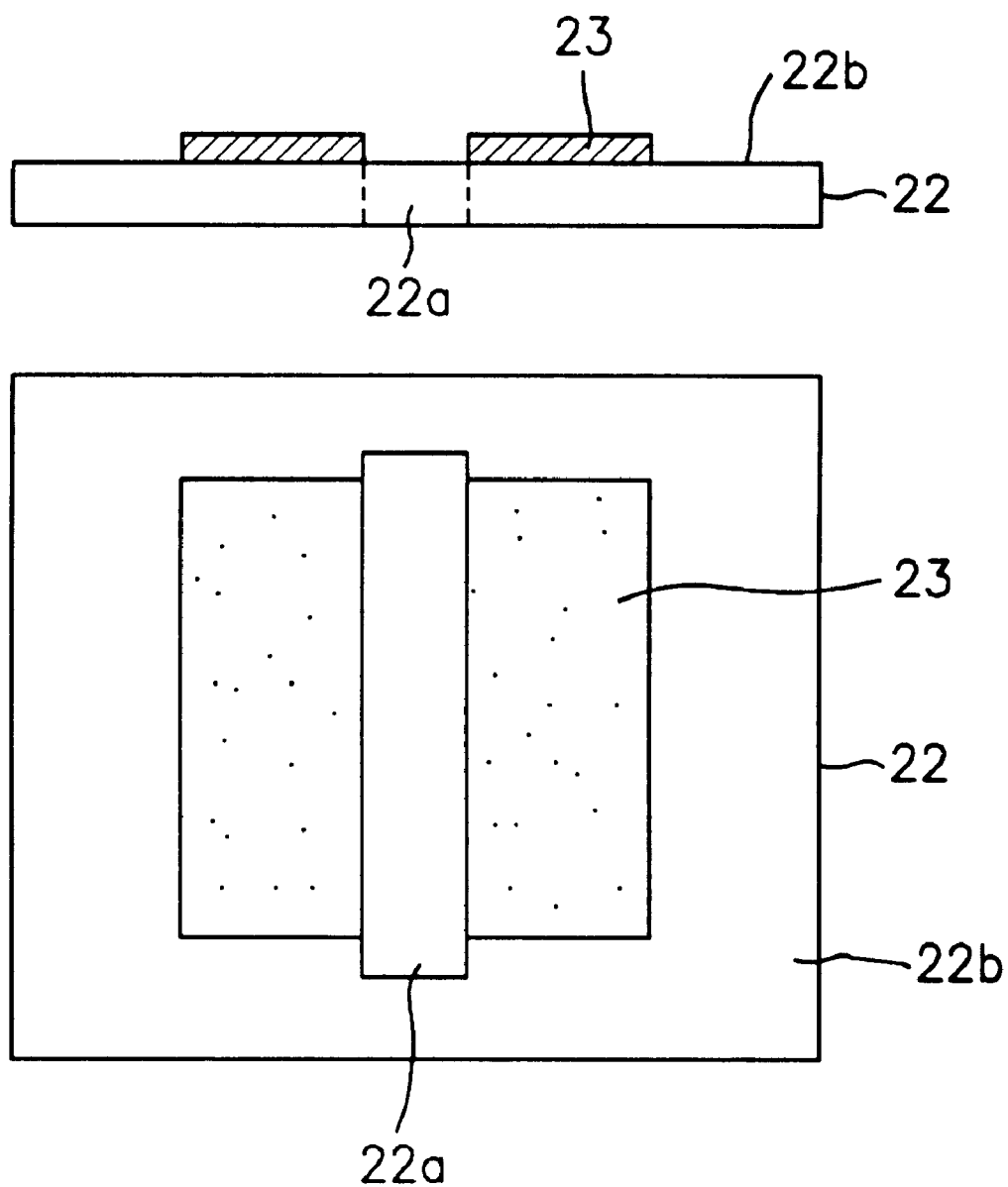
FIG. 4 is a cross-sectional view and a plan view showing the adhesion state of the tape for LOC on the substrate in FIG. 3.
Figure 5:
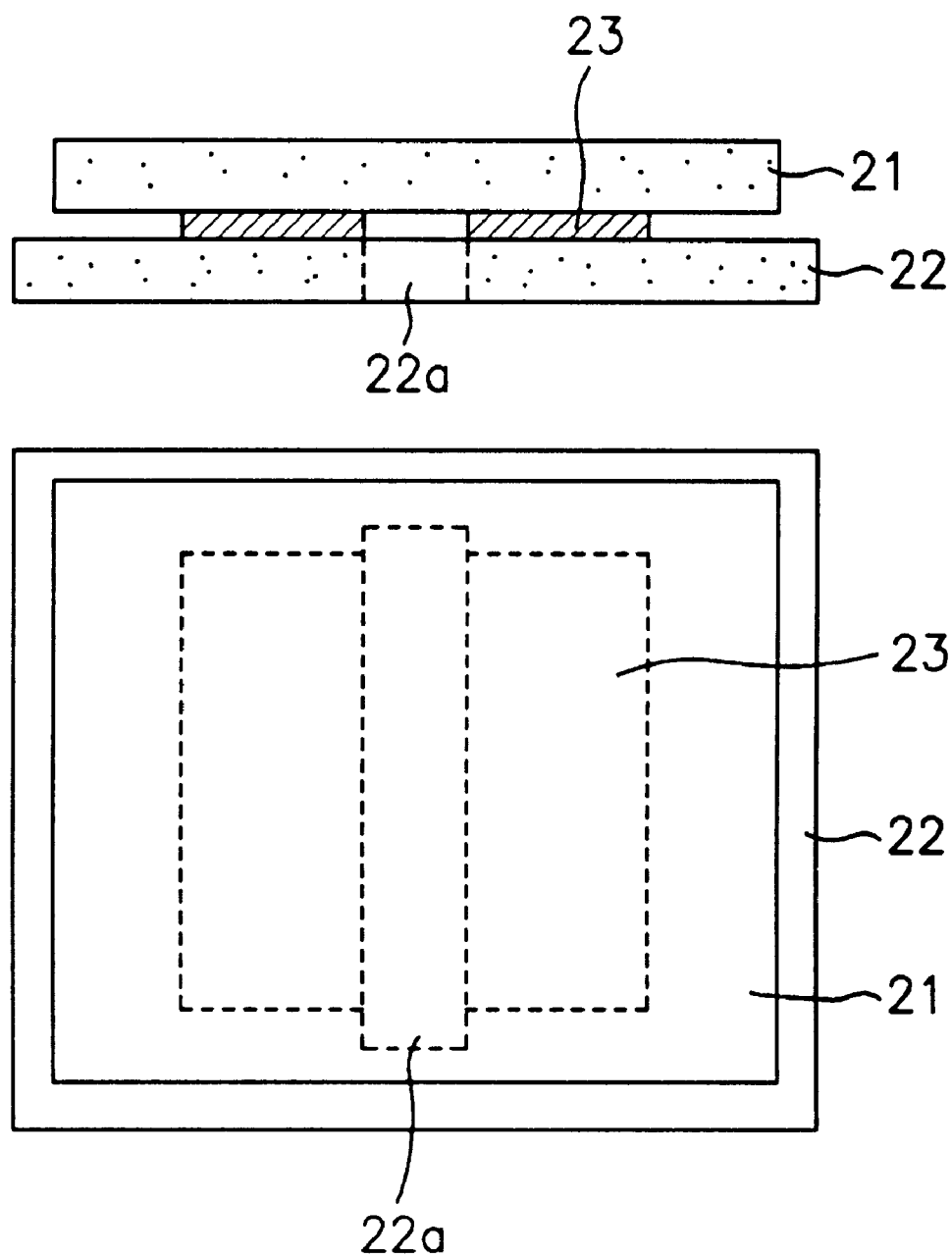
FIG. 5 is a cross-sectional view and a plan view showing the state of the chip seated on the tape supported on the substrate in FIG. 4.

In order to support the LOC type chip 21 on the substrate 22, as shown FIG. 4, the adhesive tape 23 is arranged at the edge potion of the slot 22a, on the upper surface 22b of the substrate 22.

Figure 6:
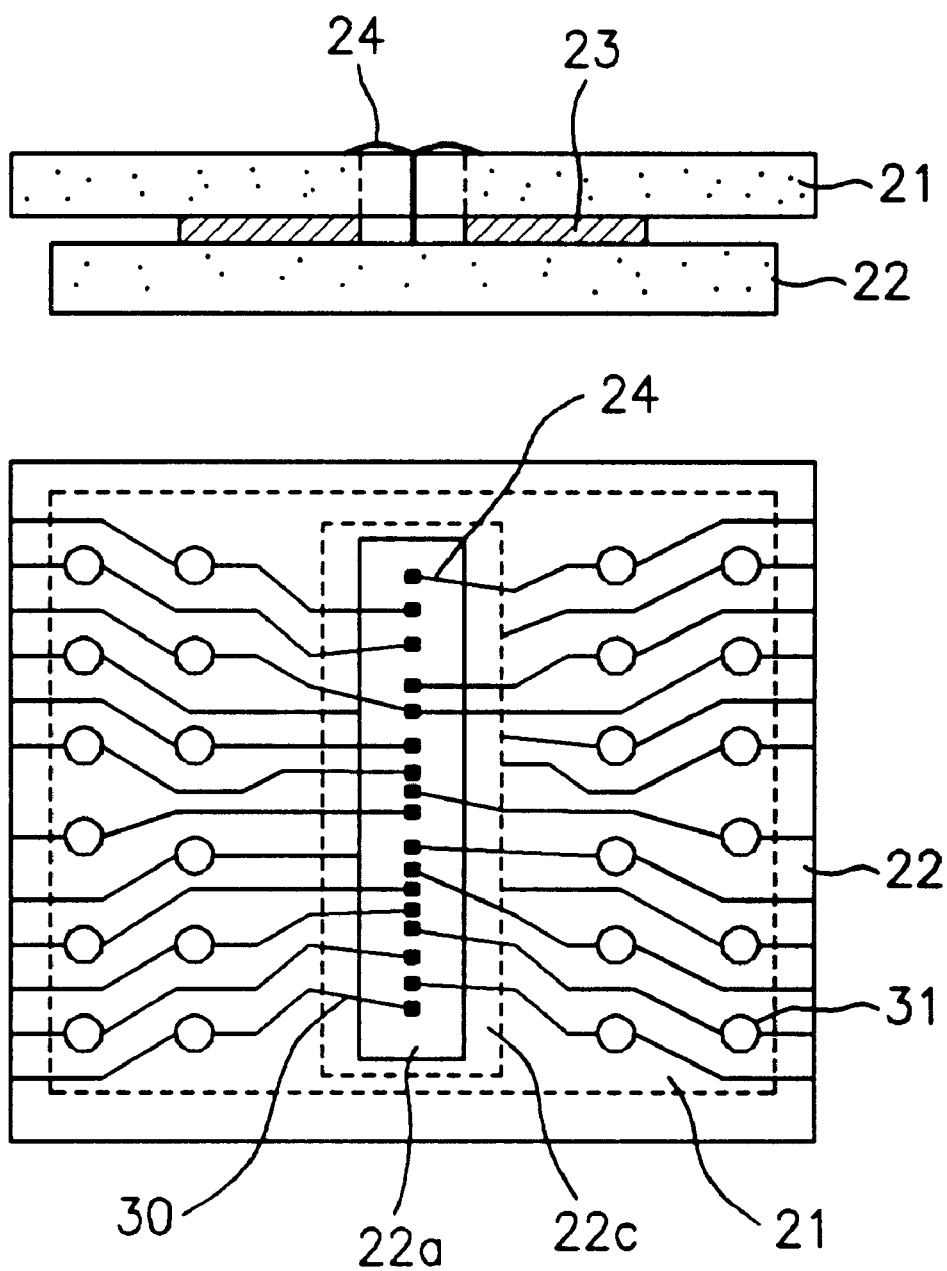
FIG. 6 is a cross-sectional view and a bottom view showing the wire-bonding state between the chip and the substrate in FIG. 5.

Next, as shown FIG. 6, the chip 21 is seated on the tape 23 so that the bonding pad of the chip may be aligned, in the slot 22a, with the center line of the slot 22a of the substrate 22. Therefore, the chip 21 is adhered to and supported on the substrate 22 through the adhesive tape 23.

In order to electrically interconnect between the chip 21 and the substrate 22, as shown FIG. 6, the bonding pad of the chip 21, which is arranged in the slot 22a, and the wire bonding portion of the signal circuit pattern 30 (indicated with break line around the edge portion of the slot 22 in FIG. 6), which is formed at the bottom surface 22c of the substrate 22, are interconnected by wires 24.

Figure 7:
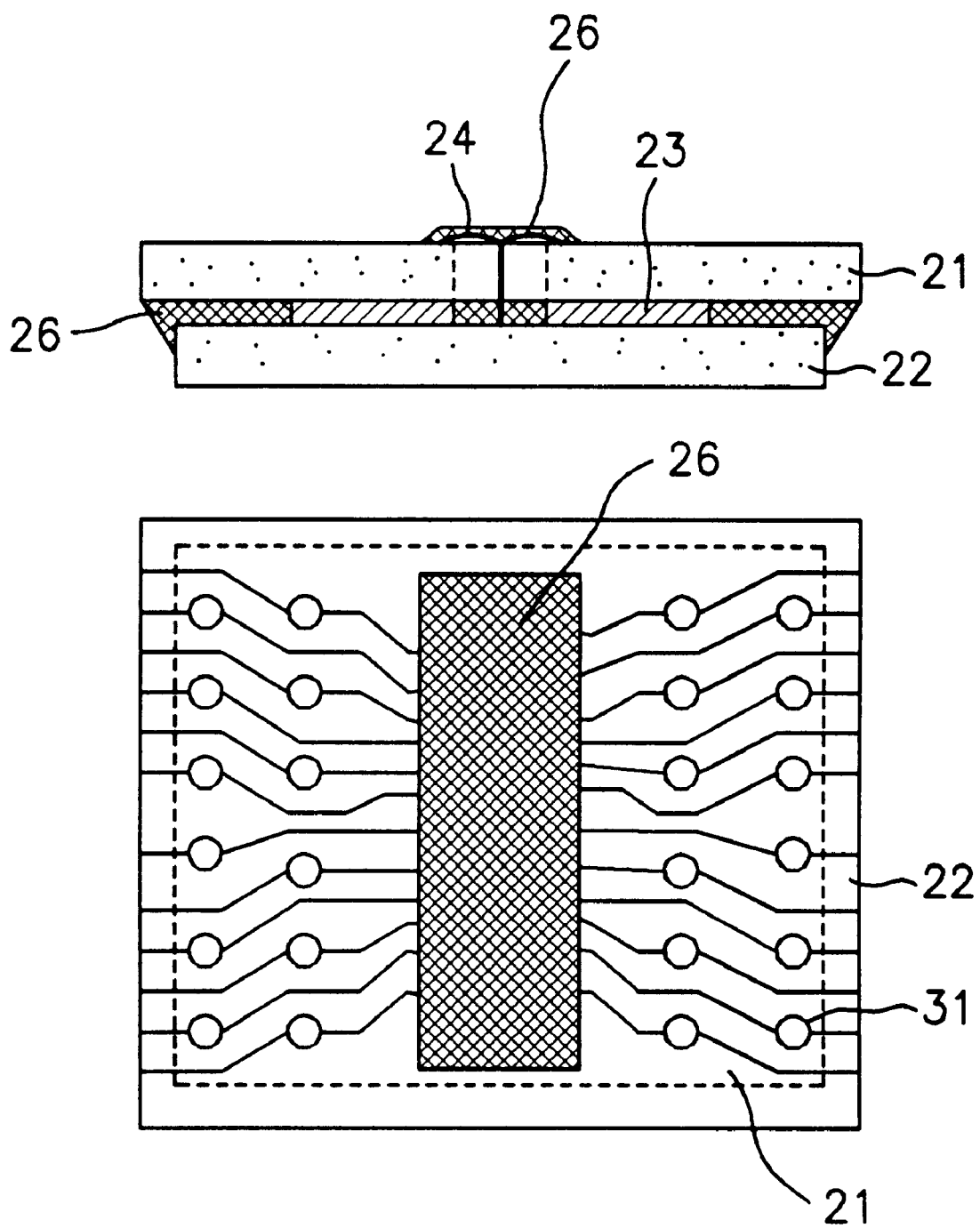
FIG. 7 is a cross-sectional view and a bottom view showing the molded state of the chip and the substrate in FIG. 6 by a under-filled coating.

After wire-bonding, as shown FIG. 7, the coating means such as epoxy resin is injected between the chip 21 and the substrate 22 to form the under-filled coating portion 26. And the injected coating means is naturally filled along the narrow gap defined between the chip 21 and the substrate 22 with a capillary phenomenon. At this time, the amount of the coating means to be injected is suitably adjusted so that it can be completely filled to the end of the chip 21.

After the coating means is completely filled, Curing is performed for hardening it.

Figure 8:
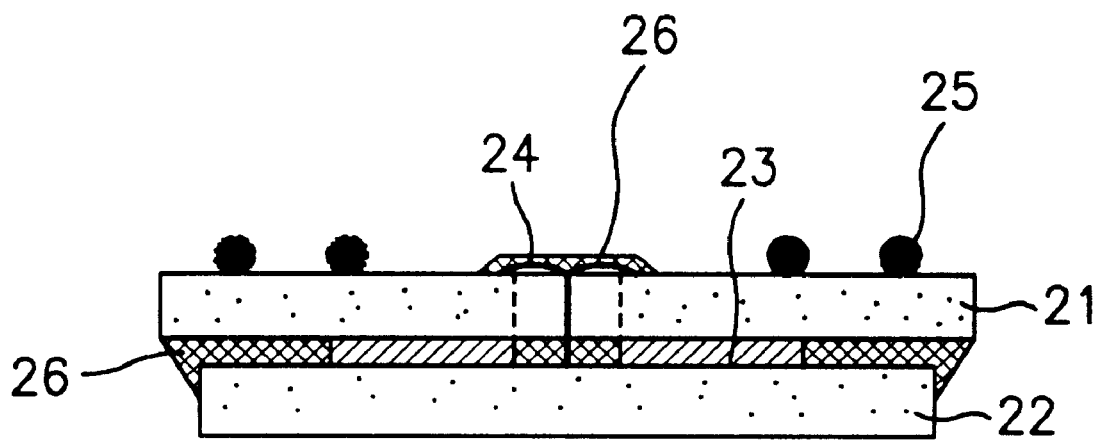
FIG. 8 is a cross-sectional view and a bottom view showing a completely assembling state of the chip-size package semiconductor, after mounting balls on the rear surface of the substrate in FIG. 7.
Figure 8:
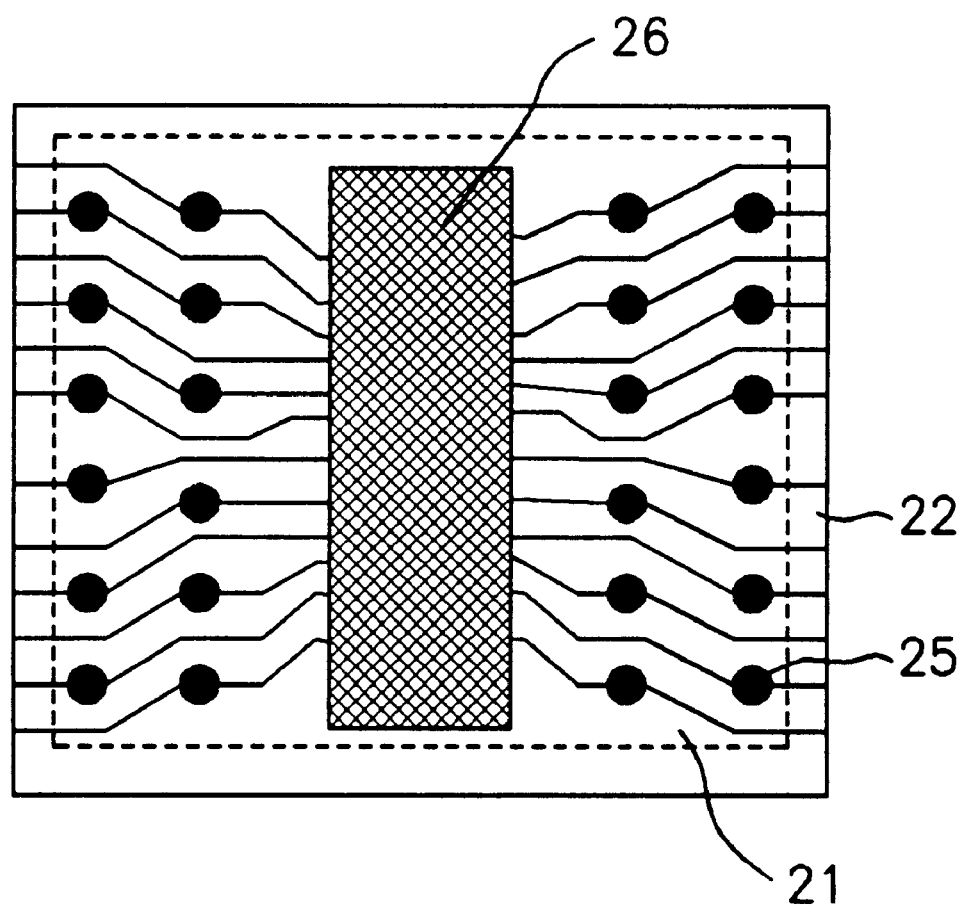

Next, in order to form the external circuit, as shown FIG. 8, each ball 25 is seated on each ball mounting portion 31 treated with flux and fixed thereon by heat-treat, for example, in an infrared heating hearth.

As stated above, in the case of the CSP of the present invention, the shape of the package is made by the injected coating means between the chip 21 and substrate 22 by the capillarity, so there is no needs for performing molding process as in the conventional CSP semiconductor. As a result, it is possible to prevent the undesirable cavity in the molding portion and the deformation of the substrate from occurring.

If the substrate is made into a multilayer structure, and the multi-type package is formed after performing the assembling process stated above using the multi-type substrate, and then the multi-type package is cut off into a CSP unit along the cutting-line, it is possible to mass-produce the CSP semiconductor, thus improving the productivity and operation efficiency, curtailing the production cost and shortening the length of the process over the whole manufacturing process of the CSP semiconductor.

Therefore, it should be understood that the present invention is not limited to the particular embodiment disclosed herein as the best mode contemplated for carrying out the present invention and is not limited to the specific embodiments described in this specification except the defined in the appended claims.

What is claimed is:

1. A chip-size package semiconductor, comprising:

a chip having a bonding pad formed at the center portion thereof;

a substrate for seating and mounting the chip thereon, which has a predetermined shaped slot formed at the center portion thereof and is formed with a signal circuit pattern on, at least, one surface thereof, wherein the substrate is made of a ceramic plate member having a predetermined size and shape;

adhesive means inserted between the chip and the substrate for attaching and fixing the chip to the upper surface of the substrate so that the bonding pad of the chip arranges above the slot;

support and protection means for supporting the chip and the substrate; and a plurality of ball members for forming an external circuit, which are mounted on the circuit pattern of the substrate, wherein the bonding pad of the chip and the signal circuit pattern of the substrate are electrically interconnected by wires to thereby form an internal circuit.

2. The chip-size package semiconductor according to claim 1, wherein the signal circuit pattern includes a plurality of a wire bonding portions where each wire led from the chip is connected and a plurality of ball mounting portions where each ball member is seated on each conductive line of the signal circuit.

3. The chip-size package semiconductor according to claim 1, wherein the support and protection means is formed by injecting and filling resin for coating between the chip and the substrate by a capillarity and then curing the filled resin by heat-treatment.

* * * * *